United States Patent [19]

Kano et al.

[11] Patent Number: 4,545,928

[45] Date of Patent: Oct. 8, 1985

[54] PASTE FOR FORMING A TRANSPARENT, ELECTRICALLY CONDUCTIVE FILM

[75] Inventors: Mitsuru Kano; Yoshimi Kamijo, both of Furukawa, Japan

[73] Assignee: Alps Electric Co., Ltd., Japan

[21] Appl. No.: 603,609

[22] Filed: Apr. 25, 1984

Related U.S. Application Data

[63] Continuation-in-part of Ser. No. 471,184, Mar. 1, 1983, abandoned.

[30] Foreign Application Priority Data

Mar. 1, 1982 [JP]  Japan ................................. 57-30516

[51] Int. Cl.[4] .............................................. H01B 1/06
[52] U.S. Cl. ..................................... 252/518; 252/500; 106/1.05
[58] Field of Search ............... 252/518, 500; 106/1.05, 106/311

[56] References Cited

U.S. PATENT DOCUMENTS 4,303,554  12/1981  Sudo et al. ........................... 252/518
4,420,500  12/1983  Nakatani et al. ............... 252/500 X
4,460,496  7/1984  Kano et al. ......................... 252/500

Primary Examiner—Josephine L. Barr
Attorney, Agent, or Firm—Guy W. Shoup; Henry T. Burke

[57] ABSTRACT

The invention relates to improved paste for forming transparent, electrically conductive films, comprising an organometallic compound that forms a transparent, electrically conductive metal oxide upon calcination, an organic solvent, and a thickening agent, said paste being blended with selected monoazo type organic pigment having defined properties. The paste of the invention has good stability, permits easy printing of line patterns, and makes it possible to form transparent, electrically conductive films that have a low resistance, high transparency and good adhesion.

7 Claims, 1 Drawing Figure

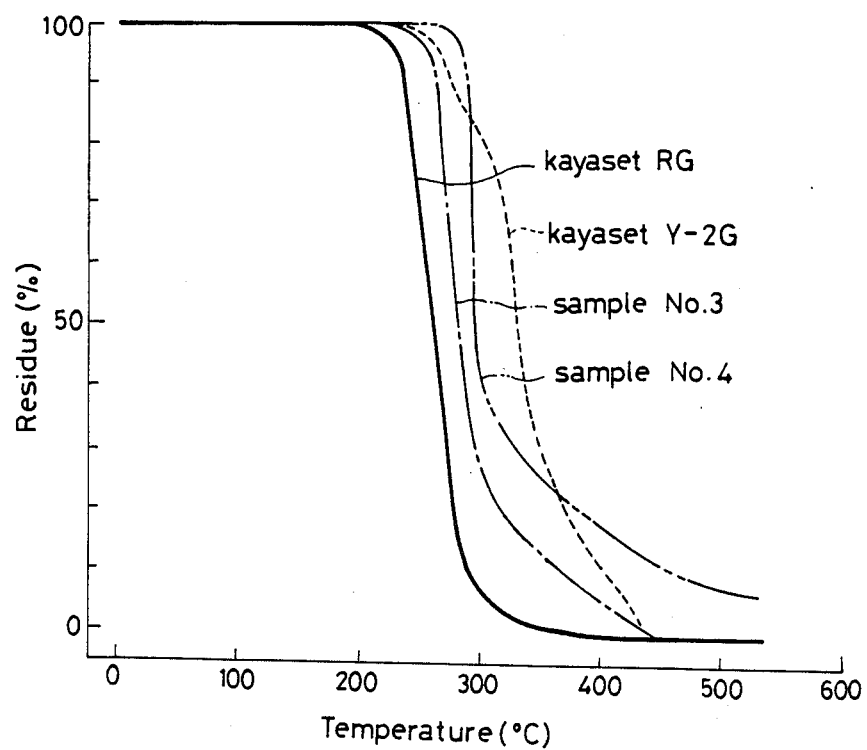

4,545,928

PASTE FOR FORMING A TRANSPARENT, ELECTRICALLY CONDUCTIVE FILM

RELATED APPLICATION

This application is a continuation in part of copending application Ser. No. 471,184 filed Mar. 1, 1983, now abandoned.

BACKGROUND OF THE INVENTION

1. Field of the Invention

The present invention relates to improved pastes for forming transparent, electrically conductive films in any desired shape, and more specifically to pastes for forming transparent, electrically conductive films which are composed of a metal oxide and which can be firmly attached to an electrically insulating substrate such as glass or ceramic by screen-printing and calcination.

It is well known that oxide films such as those of indium, tin, antimony, cadmium and the like formed on an electrically insulating substrate such as glass or ceramic have a high transmission factor and good electrical conductivity. Hence and hence these films have been increasingly used in recent years in such fields as semiconductor elements, liquid crystal display devices, electrochromic display devices, and have also been used as electrically conductive films to prevent the freezing of water on windowpanes. Transparent, electrically conductive films of such metal oxides can be formed by various methods such as chemical spraying, vacuum deposition, dipping, screen-printing, and the like.

The chemical spraying method is useful for obtaining films having relatively large areas, but is not economical when used to obtain films of fine, complex shapes, since it requires additional steps such as etching and the like.

The vacuum deposition method, on the other hand, does not require etching because of the masked deposition method which has been developed in recent years. The films prepared by this method, however, must be produced in batches and so the method is not suitable for mass production.

The dipping method is suitable for mass production, but in this method, however, the films produced have inferior properties compared with those obtained by the above methods. Moreover, an etching operation must be carried out, which reduces the practicability of the method.

The screen-printing method is free from the above problems, and enables films of any shape to be obtained by printing and calcination, without the need of treating waste liquid produced from an etching process. However, the pastes which have been produced by this method for forming transparent, electrically conductive films do not have good stability, and the operability of screen-printing is poor. Accordingly, it is difficult to print fine stable patterns.

Organometallic compounds such as indium soaps of organic acids, e.g., indium octylate, $(C_7H_{15}CO_2)_3In$, having strong ionic bonds, have heretofore been used in pastes for this method. These compounds, however, readily undergo hydrolysis. When prepared in the form of pastes, they are quickly converted into gels and undergo chemical changes relatively easily. Moreover, these pastes have low stability and hence reduced operability during screen-printing. Ethyl cellulose has been used as a binder, but when it is calcined at a temperature of, for example, 500° C., it does not burn completely. Accordingly, the resultant film has relatively high electric resistance and low strength.

In order to eliminate these defects, the inventors of the present invention have made extensive studies, and have discovered that the stability of the paste can be increased if an organoindium complex such as trisacetylacetonatoindium (III)$[In(acac)_3]$ is used as the compound which forms a metal oxide film upon calcination. It may be used together with an organotin complex such as dimethyltin acetope $[(CH_3)_2Sn(acac)_2]$, the latter compound being used to adjust resistance. The inventors have also discovered that a film which has increased adhesion and reduced resistance can be obtained if nitrocellulose is used as a thickening agent.

When nitrocellulose is used, however, the lifetime of the paste is shorter than when ethyl cellulose is used, which still leaves problems concerning the operability during screen-printing.

The inventors therefore have attempted to improve the properties further by using deoxidized nitrocellulose or a mixture of solvents such as butyl carbitol, butyl cellosolve, benzyl acetate, and dimethyl phthalate, in order to increase the printability. The improvement, however, was not sufficient. Specifically, a problem remains when fine patterns of a size of about 0.1 mm are screen-printed.

SUMMARY OF THE INVENTION

An object of the present invention is to provide a paste for forming a transparent, electrically conductive film which is free from the above defects, has good stability, permits fine patterns to be printed and the printing operation to be carried out easily, and which has film properties comparable with those of conventional films, i.e., low electric resistance, high transparency. and good adhesion.

To accomplish the above object, the above described pastes which include at least an organometallic compound, an organic solvent and a thickening agent have been improved by mixing with selected monoazo type compounds having the properties described below.

BRIEF DESCRIPTION OF THE FIGURE

The FIGURE illustrates the burning characteristics of some of the organic pigments which can be used in the present invention.

DESCRIPTION OF THE INVENTION

With screen-printing, it often happens that the viscosity of the paste increases slightly, or the pattern becomes blurred with an increase in the number of printing shots. This reduces printability and makes it difficult to print fine patterns. Because of this, in the present invention a suitable amount of a monoazo type organic pigment substituted with at least one lower alkyl group containing up to six carbon atoms, preferably at least one methyl group is added to the paste to impart thixotropy and to improve the printability and the printing life of the paste.

The alkyl group-substituted monoazo type organic pigment used in the present invention should satisfy the following requirements:

(1) The pigment is only slightly in the organic solvent used for preparing the paste, i.e. its solubility is less than about 0.2% by weight.

(2) The pigment starts to burn at a temperature below 300° C. so that its weight starts to decrease, is almost completely burned at 400° C., and only a small amount, preferably no residue is left at 500° C.

(3) The pigment is chemically inert towards the thickening agent, organic solvent or organometallic compound.

(4) The pigment is essentially free of alkali ions or metal components.

(5) The pigment is in a fine powdery form having an average particle diameter of less than 1 μm, preferably less than 0.1 μm.

Monoazo type organic pigments having the following general structural formula statisfy the above requirements.

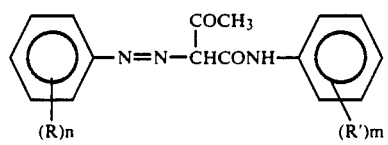

wherein n and m are positive integers up to 5 and R and R', which need not be identical, and are lower alkyl.

A typical paste to which the organic pigment is added is prepared as follows. An organoindium compound such as In(acac)$_3$ which is soluble in the selected organic solvent, and forms a metal oxide upon calcination, an organotin compound such as (CH$_3$)$_2$Sn(acac)$_2$ to adjust the resistance, an organic solvent, and a thickening agent are blended together. The selected monoazo type organic pigment may be added before or after adding the thickening agent. A typically useful thickening agent is acid free nitrocellulose.

Any of a wide variety of organic solvents can be employed in this invention. These include, for example high boiling alcohols, esters and alcohol ethers and mixtures thereof such as terpineol, 2-ethyl hexanol, benzyl alchol, benzyl acetate, carbitol acetate, dimethyl phthalate, butyl cellusolve, carbitol and butyl carbitol. Especially preferred solvent mixtures include mixtures of butyl carbitol, 40-60% by volume, and butyl cellusolve, benzyl acetate and dimethyl phthalate, each 15 to 25% by volume based on the total volume of solvent.

These solvents when used in the volume ratio of 4:2:2:1 afford excellent results.

The following non-limiting examples are given by way of illustration only. They specifically illustrate the use of the above mentioned solvent mixture and methyl substituted azo compounds. Similar results are obtained with other mono-azo compounds having the properties listed above including a variety of lower alkyl substituted mono-azo compounds in several solvents and solvent systems including those specifically illustrated above. Kayaset is a monoazo dye having the above defined properties available from Nihon Kayaku Co., Ltd. It is the presently preferred monoazo material since it leaves practically no residue when calcined at 500° C.

EXAMPLE 1

The relationship between the different kinds of monoazo type organic pigments that can be added to the paste and the printability and solubility of the monoazo type organic pigments in the mixture of organic solvents (butyl carbitol: butyl cellosolve: benzyl acetate: dimethyl phthalate=4:2:2:1) were investigated.

The pastes for testing the printability were prepared by using 2.69% by weight of In(acac)$_3$, 0.31% by weight of (CH$_3$)$_2$Sn(acac)$_2$, the above mixture of organic solvents as the organic solvent, and 13.8% by weight of an acid-free nitrocellulose (80 sec.) as the thickening agent. The selected monoazo type organic compounds were then added to this mixture in amounts determined by their solubility (% by weight) plus 1% by weight. Patterns 0.1 mm wide were formed on a 250-mesh screen made of stainless steel net. The prepared pastes were printed using a screen in order to determine the printability. The printed pastes were then pre-dried at 150° C. for 20 minutes, and were calcined at 500° C. for 30 minutes. The properties of the resultant films were investigated. The solubility, printability and properties of the films were as shown in Table 1. The solubility was tested at room temperature. In the transparency column, those films in which the visible portion is greater than 95% are indicated by the open circle, those in which the visible portion is 90 to 95% by a triangle Δ, and those in which the visible portion is less than 90% by a cross X.

TABLE 1

| Sample No. | Structure of organic pigment | Solubility (wt %) | Number of shots printed (day) | Transparency | Strength | Resistance (KΩ/cm²) |
|---|---|---|---|---|---|---|
| 1 | CH$_3$–⟨⟩(CH$_3$)–N=N–CHCONH(COCH$_3$)–⟨⟩(CH$_3$)–Cl | 0.05 | 100 | X | X | 100 |
| 2 | CH$_3$–⟨⟩(CH$_3$)–N=N–CHCONH(COCH$_3$)–⟨⟩(CH$_3$)–NO$_2$ | 0.1 | 50 | X | X | 75 |
| 3 | CH$_3$–⟨⟩(CH$_3$)–N=N–CHCONH(COCH$_3$)–⟨⟩(CH$_3$)–CH$_3$ | 0.1 | 100 | O | O | 2 |

TABLE 1-continued

| Sample No. | Structure of organic pigment | Solubility (wt %) | Number of shots printed (day) | Transparency | Strength | Resistance (KΩ/cm²) |
| --- | --- | --- | --- | --- | --- | --- |
| 4 |  | 0.05 | 130 | Δ | Δ | 5 |
| 5 | Kayaset - RG | 0.2 | 100 | O | O | 1.5 |
| 6 | Kayaset Y - 2G | 0.5 | 30 | X | Δ | 4.0 |

Products 1, 2 and 6 are not useful for the preparation of the compositions of this invention since they lack one or more of the properties listed above.

As will be obvious from the above table, excellent properties were obtained when the organic pigments of Samples 3, 4 and 5 were used, and particularly when the organic pigment of Sample 5 was used.

For a better understanding of the burning of the pigments, the thermal behaviour of the pigments was investigated. The results were as illustrated in the accompanying graph. The burning test was carried out by raising the temperature at a rate of 5° C. per minute.

As will be obvious from the graph, the thermal stability and the amount of residue at 500° C. of the films are in the order of samples 1, 2 > sample 4 > sample 3 > sample 5. It appears that the properties of the films are at least partially determined by the thermal properties, particularly by the amount of residue at 500° C., and, hence, the results of Table 1 are predicted by the results of the graph.

EXAMPLE 2

In the above example, monoazo type organic pigments were selected which satisfy the requirements for preparing pastes for forming transparent, electrically conductive films. In order to determine the appropriate amounts to be added pastes were prepared having nearly the same composition as the above example, but the amount of Sample 3 was charged. Table 2 shows the results of tests conducted in the same manner as in the above example.

TABLE 2

| Amount added (wt %) | Number of shots printed (day) | Transparency | Strength | Resistance (K/cm²) | Remarks |
| --- | --- | --- | --- | --- | --- |
| 0 | 10 | O | O | 1.5 | |
| 1 | 100 | O | O | 2.0 | |
| 3 | 150 | O | O | 2.0 | |
| 5 | 200 | O | O | 2.0 | |
| 10 | 200 | O | O | 2.5 | |
| 20 | 60 | Δ | Δ | 3.5 | highly viscous |

As will be apparent from this table, excellent printability and film properties are obtained when the amount added is between 1.0 to 10% by weight. The same test was also effected using Sample 4. The properties obtained were slightly inferior to those obtained by using Sample 3, but they were considerably superior to those of conventional films.

EXAMPLE 3

The procedure was repeated in the same manner as in Examples 1 and 2, using monoazo type organic pigments having the following structural formulas. Comparable properties were obtained.

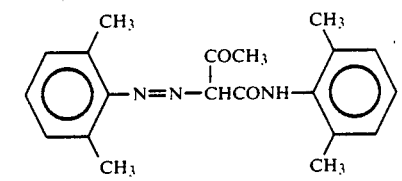 7.

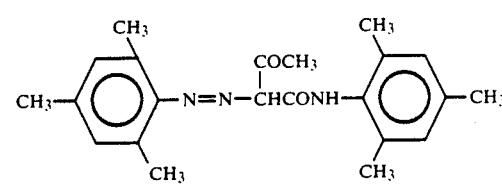 8.

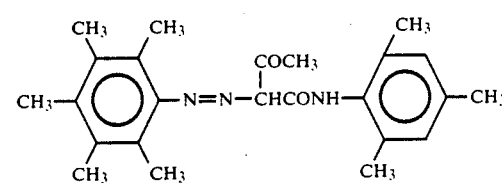 9.

When the above illustrated compounds are replaced with other monoazo compounds having the above defined properties similar results are obtained.

What is claimed is:

1. In a paste for forming transparent, electrically conductive films comprising an organometallic compound that forms a transparent metal oxide upon calcination, an organic solvent and a thickening agent; the improvement comprising blending in said paste a lower alkyl group substituted monoazo type compound having the following properties,
    a. solubility in the selected solvent is less than 0.2% by weight,
    b. starts to burn at a temperature below 300° C. and leaves little or no residue at 500° C.,
    c. is chemically inert towards the thickening agent, solvent and organometallic compound,
    d. is essentially free of alkali ions or metal components,
    e. is a fine powder comprised of particles with an average particles diameter less than 1 μm; and represented by the formula:

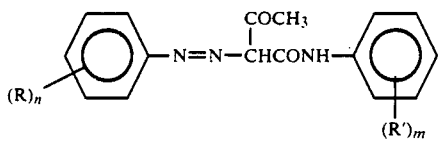

wherein R and R' are lower alkyl containing up to six carbon atoms and n and m are positive integers the total of which is 4 or 5.

2. A paste as in claim 1 wherein R and R' are both methyl.

3. A paste as in claim 2 wherein the monoazo compound is represented by the formula:

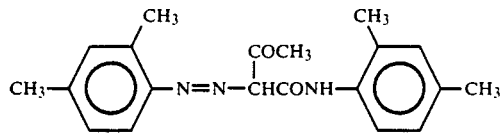

4. A paste as in claim 2 wherein the monoazo compound is represented by the formula:

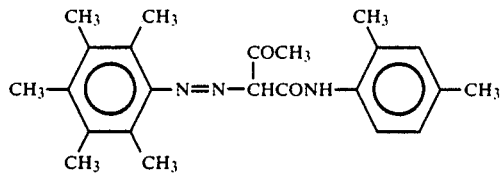

5. A paste as in claim 2 wherein the monoazo compound is represented by the formula:

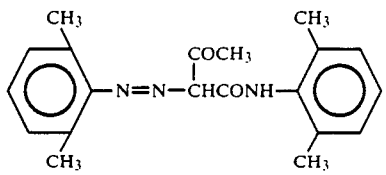

6. A paste as in claim 2 wherein the monoazo compound is represented by the formula:

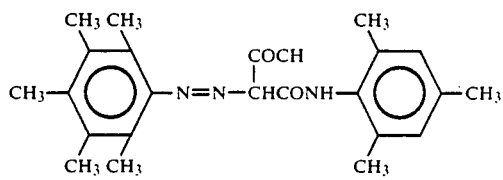

7. A paste as in claim 2 wherein the monoazo compound is represented by the formula:

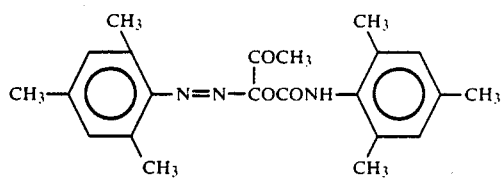

* * * * *